United States Patent
Selvamanickam

(10) Patent No.: US 7,521,082 B2
(45) Date of Patent: Apr. 21, 2009

(54) COATED HIGH TEMPERATURE SUPERCONDUCTING TAPES, ARTICLES, AND PROCESSES FOR FORMING SAME

(75) Inventor: Venkat Selvamanickam, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 576 days.

(21) Appl. No.: 10/610,072

(22) Filed: Jun. 30, 2003

(65) Prior Publication Data

US 2004/0265649 A1 Dec. 30, 2004

Related U.S. Application Data

(63) Continuation-in-part of application No. 10/344,169, filed on Jul. 23, 2003.

(60) Provisional application No. 60/233,175, filed on Aug. 7, 2000.

(51) Int. Cl.
*B05D 5/12* (2006.01)
*H01L 39/24* (2006.01)

(52) U.S. Cl. .................... 427/62; 29/599; 505/430; 505/434; 505/470

(58) Field of Classification Search ............... 427/62; 29/599; 505/430, 434, 470
See application file for complete search history.

(56) References Cited

U.S. PATENT DOCUMENTS

| 5,204,314 A | 4/1993 | Kirlin et al. |
| 5,278,138 A | 1/1994 | Ott et al. |
| 5,376,594 A | 12/1994 | Covino-Hrbacek |
| 5,536,323 A | 7/1996 | Kirlin et al. |
| 5,653,806 A * | 8/1997 | Van Buskirk ............... 118/715 |
| 5,872,080 A * | 2/1999 | Arendt et al. ............... 505/238 |
| 5,908,507 A * | 6/1999 | Onabe et al. ................ 118/718 |
| 6,037,002 A | 3/2000 | Hintermaier |
| 6,289,842 B1 * | 9/2001 | Tompa .................... 118/723 E |
| 6,797,313 B2 * | 9/2004 | Fritzemeier et al. ........... 427/62 |

FOREIGN PATENT DOCUMENTS

WO WO 02/056420 A2 7/2002

OTHER PUBLICATIONS

Yamane et al., "High Critical Current Density of YBCO superconducting film by CVD", Superconduct Science Technology, vol. 2, (1989), pp. 115-117.*

Singh et al., "Reduced Thermal Budget Processing of YBCO High Teperature Superconducting Thin Films by MOCVD", Journal of Vacuum Science Technology, vol. 9, No. 3, May/Jun. 1991, pp. 401-404.*

Yamane et al., "Preparation of High Jc YBCO film at 700 C by Thermal CVD", Journal of Applied Physics, vol. 69, No. 11, Jun. 1991, pp. 7948-7950.*

Busch et al., "High-Quality YBCO Films on Large Area by CVD", Journal of Applied Physics, vol. 70, No. 4, Aug. 1991, pp. 2449-2451.*

(Continued)

*Primary Examiner*—Brian K Talbot
(74) *Attorney, Agent, or Firm*—Larson Newman Abel Polansky & White, LLP

(57) ABSTRACT

A superconducting article is disclosed, including a substrate and a chemical vapor deposited thin film superconducting layer overlying the substrate, the superconducting layer having a critical current not less than about 100 A/cm width at 77K and self field. The superconducting article may be a tape, multiple tapes, or a power device, such as a power cable, power generator, or power transformer. Also disclosed are methods for manufacturing same and methods for using same.

20 Claims, 8 Drawing Sheets

OTHER PUBLICATIONS

Krupanidhi, S.B., "Recent Advances in Physical Vapor Growth Processes For Ferroelectric Thin Films", J. Vac. Sci. Technol. A., vol. 10, No. 4, Jul./Aug. 1992.

Swartz, S. L., "Topics in Electronic Ceramics", IEEE Transactions on Electrical Insulation, vol. 25, No. 5, Oct. 1990 pp. 935-987.

* cited by examiner

COATED HIGH TEMPERATURE SUPERCONDUCTING TAPES, ARTICLES, AND PROCESSES FOR FORMING SAME

CROSS-REFERENCE TO RELATED APPLICATION(S)

The present application is related to and claims benefit of priority to U.S. patent application Ser. No. 10/344,169, filed Feb. 7, 2003, which is the U.S. National Stage Application of and claims priority to PCT/US01/41529, filed Aug. 3, 2001 (published WO/02/056420 on Jul. 18, 2002), which in turns claims priority to U.S. Provisional Patent Application 60/223, 175, filed Aug. 7, 2000. Priority is claimed to each of the foregoing applications.

BACKGROUND

1. Field of the Invention

This invention relates generally to high temperature superconducting materials, components and articles incorporating same, and processes for forming same.

2. Description of the Related Art

High temperature superconducting (HTS) materials have immense potential for use in electric power, electronics, and medical industries. Presently, the HTS material that is manufactured in considerable quantities by industry is based on (Bi,Pb)SrCaCuO (BSCCO) superconductor. This material and the process used to manufacture it have proven to be expensive. Furthermore, the properties of this material degrade quickly in the presence of magnetic fields that are generated in a number of electric power devices.

ReBaCuO (Re=rare earth) superconductor is being developed as a potential alternative to the BSCCO superconductor. When fabricated in the form of a thin film coated on a metal substrate (HTS coated conductor), this material exhibits superior current carrying capability compared to BSCCO.

Several deposition processes are being developed to fabricate HTS Coated conductor. In general, thin film deposition techniques can be classified into two major categories: (1) physical vapor deposition (PVD) and (2) chemical processes (see "The Material Science of Thin Films", Milton Ohring, Academic Press, 1992; S. L. Swartz, IEEE Transactions on Electrical Insulation, 25(5), 1990, 935; S. B. Krupanidhi, J. Vac. Sci. Technol. A, 10(4), 1992, 1569).

Most of the approaches are based on physical vapor deposition techniques where a source of HTS material is vaporized by means of (1) ablation with a high power laser, (2) evaporation using an electron-beam source, or (3) sputtering using high energy argon ions.

However, these techniques are limited in several ways. First, they are all limited by line of sight i.e., the vapors can coat the substrate only where they can 'see' the substrate, which means that the coated area is small. This limits the throughput of coated tape. Second, the composition of the coated film is limited to the composition of the material being vaporized. Third, the source material has to be maintained under vacuum causing refill to be difficult and in turn poses a problem for long-length manufacturing. Fourth, the source material has to be formed into a monolith, which adds cost to the process. Fifth, a high vacuum is needed which increases cost of capital equipment The chemical processes can further be divided into two subgroups i.e., chemical vapor deposition and wet chemical processes including sol-gel and metalorganic decomposition (MOD).

Generally speaking, wet chemical processes such as sol-gel and MOD for deposition of thin films are popular because of their simplicity. However, wet chemical processes have limitations including rate of conversion of precursor to film, thickness control, need for multiple steps for film formation (deposition, bakeout, & heat treatment as a minimum), need for repeating these multiple steps multiple times to build thick films, carbon residue incorporation in the films, difficulties in epitaxial growth in thick films, and evolution of harmful byproducts such as HF if fluorinated precursors are used.

On the other hand, chemical vapor deposition is a particularly attractive method for forming thin film materials because it is readily scaled up to production runs and because the electronic industry has a wide experience and established equipment base in the use of CVD technology, which can be applied to new CVD processes. In general, the control of key variables such as stoichiometry and film thickness, and the coating of a wide variety of substrate geometries is possible with CVD. Forming the thin films by CVD permits the integration of these materials into existing device production technologies. CVD also permits the formation of layers of materials that are epitaxially related to substrates having close crystal structures.

A wide variety of source materials for chemical processing have been employed to form thin films, layers and coatings on substrates. These source materials include reagents and precursor materials of widely varying types, and in various physical states. Vapor deposition has been used widely as a technique to achieve highly uniform thickness layers of a conformal character on the substrate. In vapor phase deposition, the source material may be of initially solid form that is sublimed or melted and vaporized to provide a desirable vapor phase source reagent. Alternatively, the reagent may be of normally liquid state, which is vaporized, or the reagent may be in the vapor phase in the first instance.

In the liquid delivery approach, the liquid or solid precursor is typically dissolved in a solvent, and the solution is stored, e.g., at ambient temperature and pressure. When the deposition process is to be run, the solution is transported to a high temperature vaporization zone within the CVD system, where the precursor is flash vaporized (along with the solvent), and the gas-phase precursor then is transported to the deposition zone, such as a chemical vapor deposition reactor, containing a substrate on which deposition of the desired component(s) from the vapor-phase precursor composition takes place.

The liquid delivery technique has been found to be useful for deposition of multicomponent oxide thin films such as $(Ba,Sr)TiO_3$, $SrBi_2Ta_2O_9$, (SBT), (Pb, La) $TiO_3$, (PLT) and $Pb(Zr, Ti)O_3$ (PZT) for example. In CVD processes developed for these and other compounds, it is desirable to dissolve all the precursors in solution, and vaporize them, following which the vaporized precursor composition containing the respective components is transported to the deposition chamber, as described above.

Liquid delivery systems of varying types are known in the art, and for example are disclosed in U.S. Pat. No. 5,204,314 issued Apr. 20, 1993 to Peter S. Kirlin et al. and U.S. Pat. No. 5,536,323 issued Jul. 16, 1996 to Peter S. Kirlin et al., which describe heated foraminous vaporization structures such as microporous disk elements. In use, liquid source reagent compositions are flowed onto the foraminous vaporization structure for flash vaporization. Vapor thereby is produced for transport to the deposition reactor. The liquid delivery systems of these patents provide high efficiency generation of vapor from which films may be grown on substrates. Liquid delivery systems of such type are usefully employed for generation of multicomponent vapors from corresponding liquid reagent solutions containing one or more precursors as solutes, or alternatively from liquid reagent suspensions containing one or more precursors as suspended species.

The simplicity of such liquid delivery approach has been fortuitous, because each component in this system of metalorganic precursors can be treated identically in the respective solution-forming, vaporization and transport steps of the process.

The present inventor has recognized that CVD using metalorganic precursors (MOCVD) would be a desirable technique for fabrication of films of various materials including HTS. However, MOCVD has yet to be shown to be a viable approach to achieve high current and high current density with HTS Coated conductors because suitable MOCVD apparatuses and processes have not been developed.

In view of the state of the art, it is generally desirable to form HTS conductors and components therefrom having desirable electrical properties, and form such conductors by techniques that are commercially viable.

SUMMARY

According to a embodiment of the present invention, a superconductor article is provided, having a substrate and a chemical vapor deposited thin film superconducting layer overlying the substrate, the superconducting layer having a critical current not less than about 100 A/cm width at 77K and self field.

According to another embodiment of the present invention, a power device is provided containing at least one superconductive tape having a substrate and a chemical vapor deposited thin film superconducting layer overlying the substrate, the superconducting layer having a critical current not less than about 100 A/cm width at 77K and self field. The power device may take on one of several forms, including a power cable, power generator, power transformer. Additional embodiments include a power grid containing multiple commercial power devices.

According to another embodiment, a method of forming a high temperature (77K) superconductor is provided, including providing vapor phase reactants in a deposition chamber, and depositing a reaction product of the reactants onto a substrate in the deposition chamber to form a high temperature superconducting thin film, the thin film having a critical current not less than about 100 A/cm width at 77K and self field.

DETAILED DESCRIPTION

Figure 1:
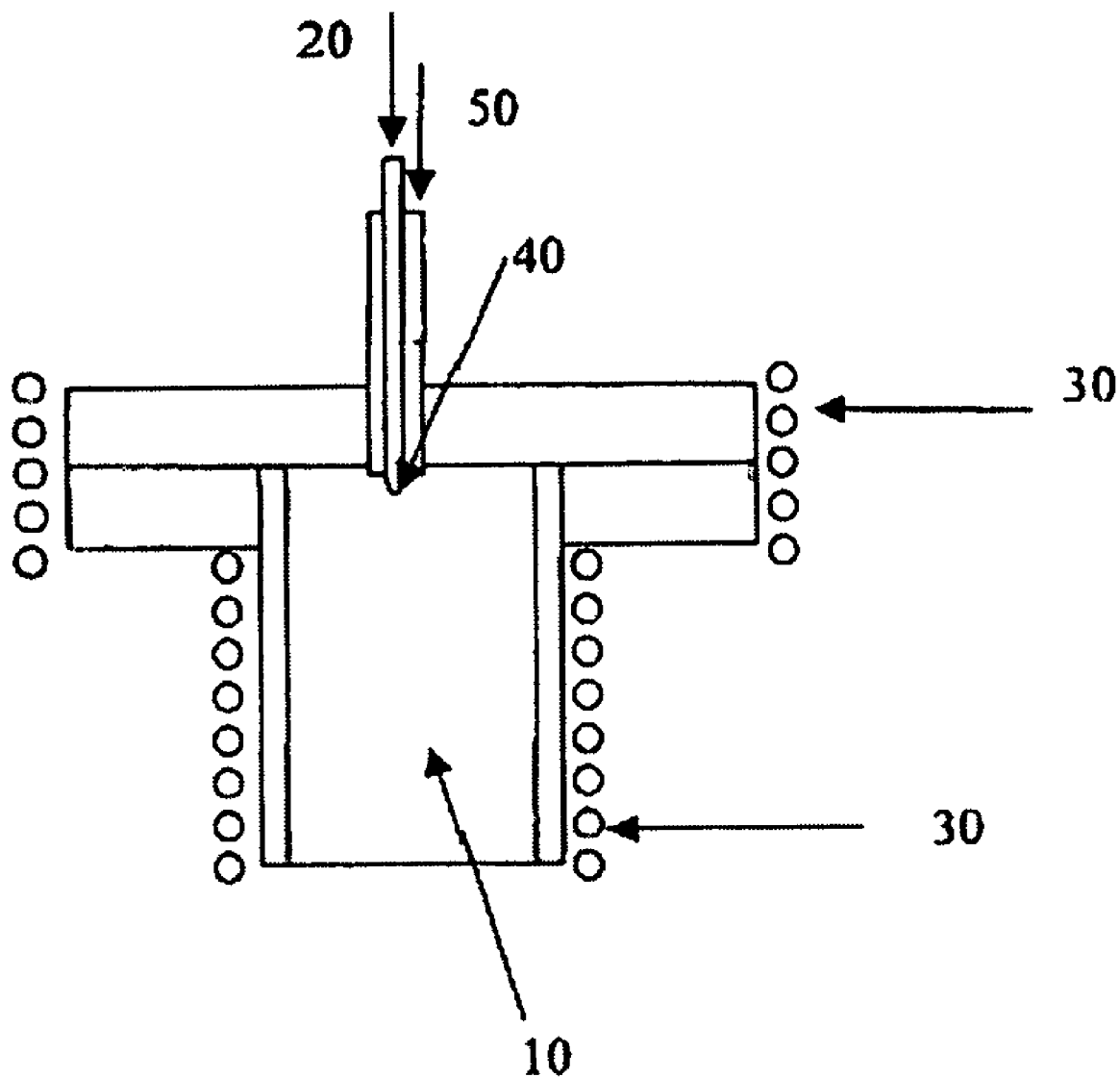
FIG. 1 is a schematic drawing of the vaporizer showing the orifice and heating elements.

According to a first aspect of the present invention, a CVD process, and in particular a MOCVD process utilizes precursors having desirable properties. In particular, the precursors according to embodiments of the present invention generally have high vapor pressure at low vaporization temperatures, low decomposition temperature, large "windows" between vaporization and decomposition temperatures, minimal contamination from organic constituents of the precursors, stability under ambient conditions and nontoxicity. In embodiments of the present invention, tetramethyl heptanedionates have been used as precursors to grow the complex layered structure films.

A liquid precursor is preferred to achieve high performance in HTS coated conductors fabricated by MOCVD. Advantages of liquid precursors over solid precursors include a single point of temperature control for vaporization, longer period of stability and easy refill, both of which are critical for long-length tape manufacturing, and higher precursor feed rates, which is important for high rates of deposition. Long lengths of tape typically have an aspect ratio that are on the order of not less than about $10^3$, $10^4$, or $10^5$, where aspect ratio is the ratio of the longest dimension (length) of the tape to the next longest dimension (width). Precursors that are especially useful are tetramethyl heptanedionate compounds of yttrium (or other rare earth such as Sm, Nd, Yb, Eu, Gd, Dy, Ho, Er), barium and copper. The Ba compound is preferably adducted with a compound such as phenanthroline to assure long-term stability. Each compound may be individually dissolved in solvents such as tetrahydrofuran and isopropanol. Both THF and isopropanol may be used to dissolve the Y and Ba compounds, and THF alone can be used to dissolve the Cu compound. When the precursors have dissolved, the individual solutions are mixed together.

Tetramethyl heptanedionates of yttrium, barium [adducted with phenanthroline] and copper are obtained from InOrgatech, Mildenhall Suffolk, U.K. The Y compound is dissolved in solvent containing 2 parts of THF and 1 part isopropanol. The Ba compound is dissolved is a solvent containing 3.5 parts THP and 1 part isopropanol. The Cu compound is dissolved only in THF.

When the individual precursors are dissolved they are mixed together in a ratio determined by the desired composition of the thin film. It is one of the particular benefits of the process that the film characteristics can be varied over a wide range by modifying the ratio of the precursors in the combination. The molarity of overall solution is generally in the range of from about 0.003 M/l to about 0.03 M/l.

The ratio of the rare earth, Ba and Cu compounds, as determined by the elemental ratio in the precursor solution may be between 1 to 1.65-2.65 to 3, preferably 1 to 2-2.3 to 3, and most preferably 1 to 2.15 to 3. The three solutions are combined by low shear mixing to form a uniform solution.

The liquid precursor solution is then generally pumped at a constant rate of from about 0.1 to about 10 ml/min into the vaporizer using a low-flow rate, high-pressure pump such as a HPLC (High Pressure Liquid Chromatography) pump. The pump should be capable of delivery of low flow rates with a high accuracy and without pulsation. The wetted components of the pump should not react with the precursor solution. The rate of introduction will of course depend on the size of the vaporizer and deposition reactor. A rate of approximately 0.25 ml/min is suitable for a deposition rate of about 2 microns/hour.

A vaporizer is used to flash evaporate a liquid precursor is generally maintained at a steady temperature. More importantly, the vaporizer should be maintained clog-free. Several designs of vaporizer including commercially available vaporizers such as MKS Model # DLI25BS99 have failed for use with the liquid precursors of embodiment of the invention because of vaporizer clogging by the Ba precursor. It is also generally desirable that the vaporizer be designed to avoid streaming of the precursor solution, which is caused by suction of the solution by the vacuum in the system, and designed to avoid deposits of the precursor.

Referring to FIG. 1, a vaporizer 10 is a cylindrical vessel constructed of non-reactive materials. Mounted at one end of the cylinder is an inlet for the introduction of precursor solution to the vaporizer. The precursor is preferably delivered to the vaporizer through small bore tubing 20. The tubing is maintained wet using solvent when the vaporizer is not in operation to avoid clogging. A heater 30 is placed around the exterior of the vaporizer body to maintain a high and even temperature distribution.

The precursor entry tubing ends in an orifice tip 40 with a diameter in the range of from about 10% to about 50% of the diameter of the delivery tubing. This narrow opening builds pressure and prevents suction of the precursor by the vacuum in the vaporizer. A typical orifice opening is from about 0.001 to about 0.005 inch inside diameter.

The delivery tubing is surrounded by an annular carrier gas delivery element 50, typically in the form of annular tubing surrounding the precursor delivery tube 20. The carrier gas, typically argon, enters the vaporizer through delivery element 50 and is used to push the precursor exiting from nozzle 40 downward away from the orifice and into the body of the vaporizer 10.

The region of the vaporizer above the orifice is minimized to prevent precursor deposits.

The solution of mixed precursors is rapidly heated in the vaporizer to a temperature in the range of from about 180 to about 300° C., preferably from about 210 to about 270° C., and most preferably from about 230 to about 240° C. and is pumped to a vaporizer. It enters the vaporizer through tubing swaged to a nozzle of about 0.004" ID orifice where the solution is flash vaporized. The pressure in the feed tubing is in the range of from about 0 to about 15 psi, preferably from about 0 to about 10, and most preferably from about 0 to about 5 psi. The pressure in the vaporizer is in the range of from about 1 to about 15 Torr, preferably from about 1 to about 10 Torr, and most preferably from about 2 to about 5 Torr.

A tubing of very small diameter, shaped into a small orifice at the tip to build enough pressure to avoid sucking of precursor by reactor vacuum is generally preferred (too small a diameter will end up in clogging, too large a diameter will prevent pressure buildup). The tip of the tubing is typically placed in a high temperature zone in the vaporizer, since the precursors will not vaporize instantaneously if the tip is placed in a low temperature zone. The region above the tip of the delivery tubing is generally minimized and maintained at a high temperature, both for avoiding formation of precursor deposits. The outlet for the argon 'push gas' is generally placed around the orifice to push the vaporized precursors downward. The tubing may be cleaned with solvent such as THF at high pressure after the deposition run to avoid clogging. According to one embodiment, the tubing is maintained to be wet prior to ramping the vaporizer to set temperature. The tip of the tubing is generally maintained approximately at 230° to 240° C.

In one embodiment, the cross-section of the delivery tube is maintained to be greater than that of the tubing 20 to avoid deposits of the precursor.

In a preferred embodiment, the orifice is sized to inject approximately 0.25 ml/min of precursor into the vaporizer. In another preferred embodiment an annular inert gas injector used to force the precursor vapors downward away from the orifice. In general, it is useful to supply the inert gas to the vaporizer at a rate of about 500 to 4000 ml/min. Argon is the preferred inert gas but nitrogen or other inert gas may be used.

The vaporizer is connected to the deposition reactor through small-bore tubing. The minimum diameter of the tubing is 0.25"; the maximum is 5". Preferably, the diameter of the tubing is in the range of from about 1 to about 1.5".

Figure 2:
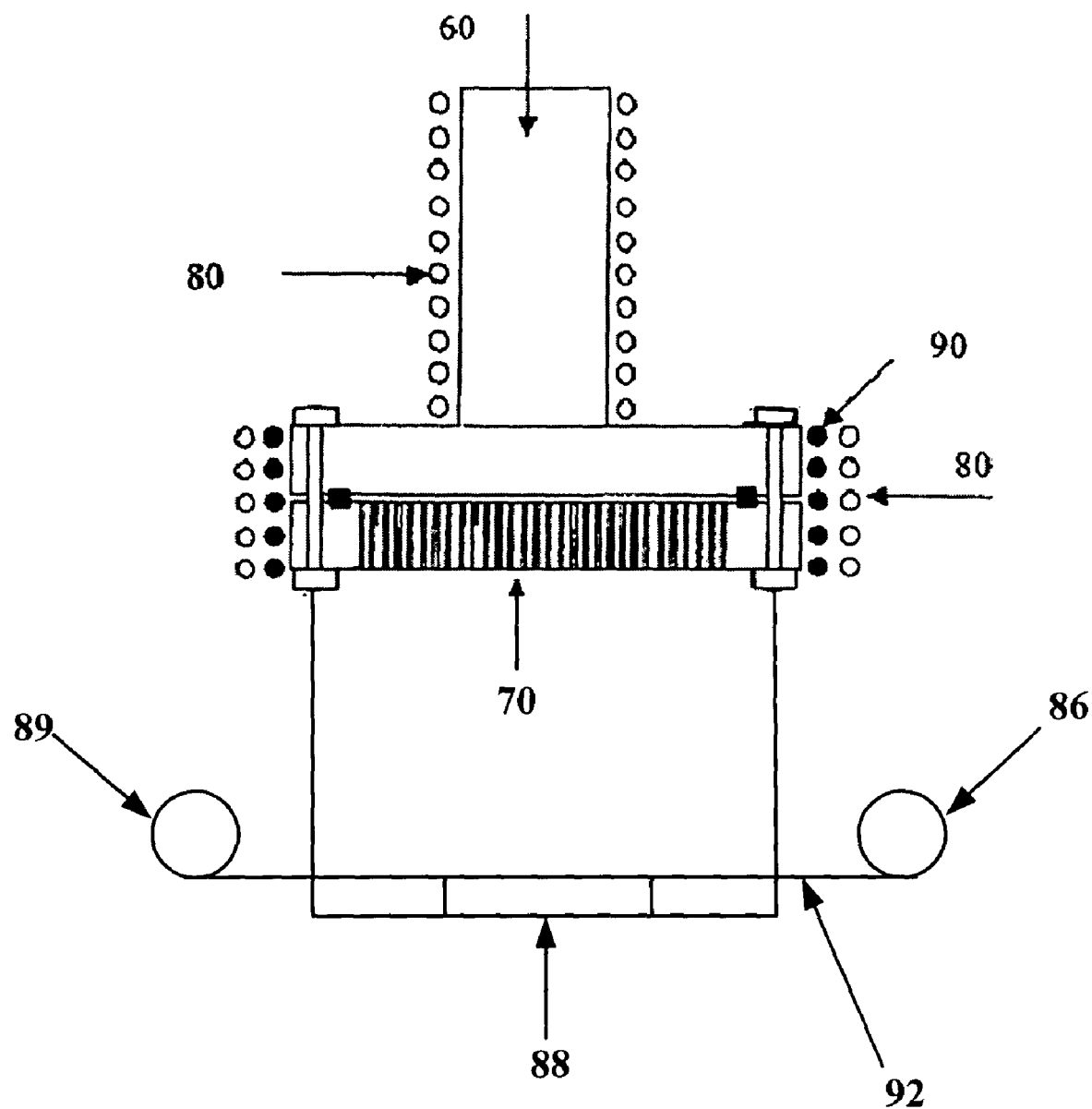
FIG. 2 is a schematic drawing of the deposition reactor showing the showerhead, the oxygen injector and the heating and cooling coils.

Referring to FIG. 2, vaporized precursors are received from vaporizer 10 [not shown] through delivery tubing 60 along with introduced oxygen. The vaporized precursors and oxygen are dispersed into the deposition chamber 82 by means of showerhead 70. In the deposition chamber, the substrate is passed through the deposition chamber via a reel-to-reel process including feed reel 84 and take-up reel 86, the substrate 93 passing along support 88. The vaporized precursors are maintained at an appropriate temperature prior to entry into the showerhead 70 by heating element 80 placed around the delivery tubing. The temperature of the vaporized precursors is maintained at an appropriate temperature as it passes through the showerhead 70 by heating element 90 and cooling element 80.

A high temperature valve with a direct line of sight and uniform bore is generally used between the vaporizer and reactor. The path of the precursor vapor should not be obstructed prior to injection into the reactor showerhead. Oxygen is generally introduced close to the precursor injection point and is preferably uniformly directed over the entire showerhead. A showerhead in the form of a disc with small perforated holes is a suitable way to achieve such an uniform flow. If it is introduced non-uniformly, the film growth will be non-uniform when depositing on large areas. The entire delivery line from the vaporizer to showerhead should be maintained between 230° and 270° C.

The precursor vapors are uniformly injected over the entire substrate area using a showerhead. The showerhead is preferably constructed with numerous fine openings; the total cross sectional area of the openings should be less than the cross sectional area of the precursor delivery tubing. The perforations typically have a length to direct the flow downward. The showerhead is generally maintained in a temperature range of 230° to 270° C. prior to film deposition. A shutter may be used between the showerhead and the substrate heater prior to film deposition so as to minimize film formation at a lower temperature while the substrate heater is ramped up to deposition temperature. The showerhead may not reach the preferred temperature range mentioned above with the shutter in place. A suitable way to achieve the desired showerhead temperature is to install a heater around the showerhead itself. However, after the shutter is opened the showerhead may overheat due to exposure to the heat from the substrate heater. To attenuate this problem, a cooling coil may be implemented around the showerhead. To facilitate cooling, the showerhead may be constructed of a single block of metal, the cooling coil welded to it and the heating coil placed around the cooling coil.

The vaporized precursors are delivered from the vaporizer to the deposition chamber through a showerhead. The showerhead is preferably constructed with numerous fine openings, the total cross sectional area of which is less than the cross sectional area of the precursor delivery tubing in one embodiment. The perforations generally have a length to direct the flow downward, onto the substrate but not so long as to prevent adequate spread. Lengths of from about 1 to about 10 mm have been found useful. A cooling coil welded to the showerhead and a heating coil surrounding the showerhead may be provided to maintain constant temperature (230° C. to 270° C.). Prior to film deposition, when the shutter is closed, the heating coil heats up the showerhead.

During deposition, when the shutter is open and the showerhead is exposed to the substrate heater, the cooling coil cools the showerhead. To facilitate cooling, the showerhead may be constructed of a single block of metal and the cooling coil be welded to it and the heating coil placed around the cooling coil.

A high temperature valve with a direct line of sight and uniform bore should be used between vaporizer and reactor. The path of the precursor vapor should not be obstructed prior to injecting to the showerhead.

Oxygen is generally introduced to the reactor along with the precursors, preferably uniformly directed over the entire showerhead. A ring with small perforated holes is a suitable way to achieve such a uniform flow. If introduced nonuniformly, the film growth will be nonuniform when depositing on large areas. In one embodiment, the entire delivery line from the vaporizer to showerhead is maintained between 230° C. and 270° C.

The substrates to be coated are generally heated to about 700° to 850° C., preferably about 750° to 800° C. Lower reactor pressure in the lower portion of the range, oxygen partial pressure in the lower portion of the range and substrate temperature in the higher portion of the range are found to favor formation of high quality HTS films on commercial substrates.

The substrate may be any metallic substrate conventionally used as a substrate for HTS films. Stainless steel or nickel alloy are particularly well suited. The substrate heater should be placed at a distance of about 15 to 30 mm from the showerhead. If it is placed too closely, the showerhead will overheat due to the heat from the heater. Also, the precursor may decompose and result in deposition of particles on the substrate. If it is kept too far, the thickness of the film will be reduced and the precursors may condense into their individual constituents.

The MOCVD reactor is preferably a cold-wall type, i.e., the walls of the reactor are not heated. The pressures in the reactor and the by-pass line are maintained constant using throttle valves that are automatically controlled by pressure readings using capacitance manometers.

At reactor start-up, and until the reactor reaches optimum operating conditions, the vaporized mixture of precursors is shunted to a by-pass line maintained at the same pressure as that in the MOCVD reactor. After the substrates are heated to deposition temperature, the vapor flow is switched to the reactor input line. This procedure is accomplished using two high temperature valves.

A pressure of 1 to 5 Torr, preferably 1 to 2.5 Torr, most preferably 1.6 Torr is maintained in the reactor (as well as in the by-pass line). The low reactor pressure in the presence of high gas flow rates is preferably achieved using a roots blower-vacuum pump system. Alternatively, relatively higher pressures may be utilized. In this regard, typically the reactor is operated in a low-pressure state, namely, below atmospheric pressure, 760 Torr. Pressures may range up to about 500 Torr, 200 Torr, or 100 Torr.

Oxygen is flowed into the reactor to achieve a partial pressure of about 0.3 to 1 Torr, preferably 0.35 to 0.8 Torr, most preferably about 0.55 Torr. Alternatively, relatively high oxygen partial pressures may be implemented, such as up to about 100 Torr.

After deposition, the films are cooled at a controlled rate in a high partial pressure of oxygen (100 to 760 Torr) to room temperature. In general, it will require from about 30 to about 60 minutes to complete the cooling.

According to embodiments of the present invention, precursors are used the above-described CVD processes that may be dissolved in the same solvent with high solubility, maintain their identity in the single solution without deleterious chemical reactions with the solvent or net ligand exchange with each other, may be efficiently vaporized under the same temperature flow, pressure and ambient (carrier) gas conditions, and help enable CVD deposition processes using a fixed ratio of the CVD precursors in the solution, a distinct advantage since the relative proportions of the respective components cannot be easily quickly changed.

Figure 3:
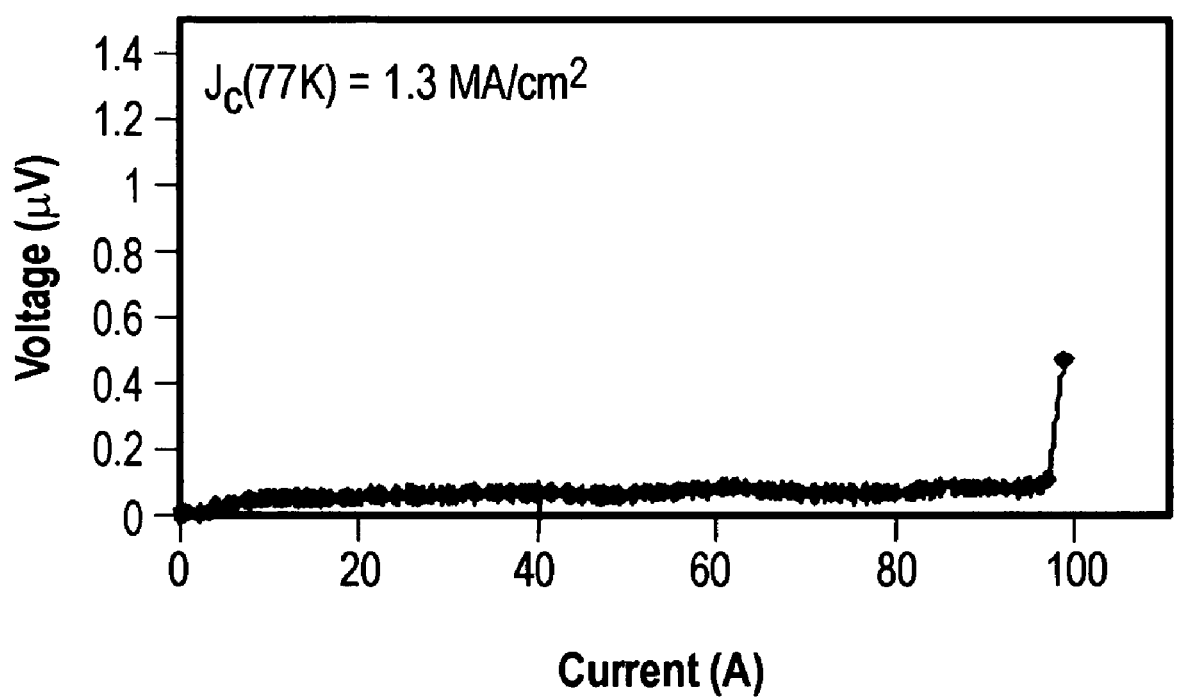
FIG. 3 is a chart showing the current-voltage curve from a high-current YBCO on metal substrate prepared utilizing the inventive process.

Using the process and system design described above, critical currents of about 100 A (130 A/cm width) and current density of 1.3 MA/cm$^2$ have been achieved for the first time in HTS coated conductor. FIG. 3 demonstrates the high performance results achieved in a YBC coated conductor fabricated by the claimed process.

Figure 4:
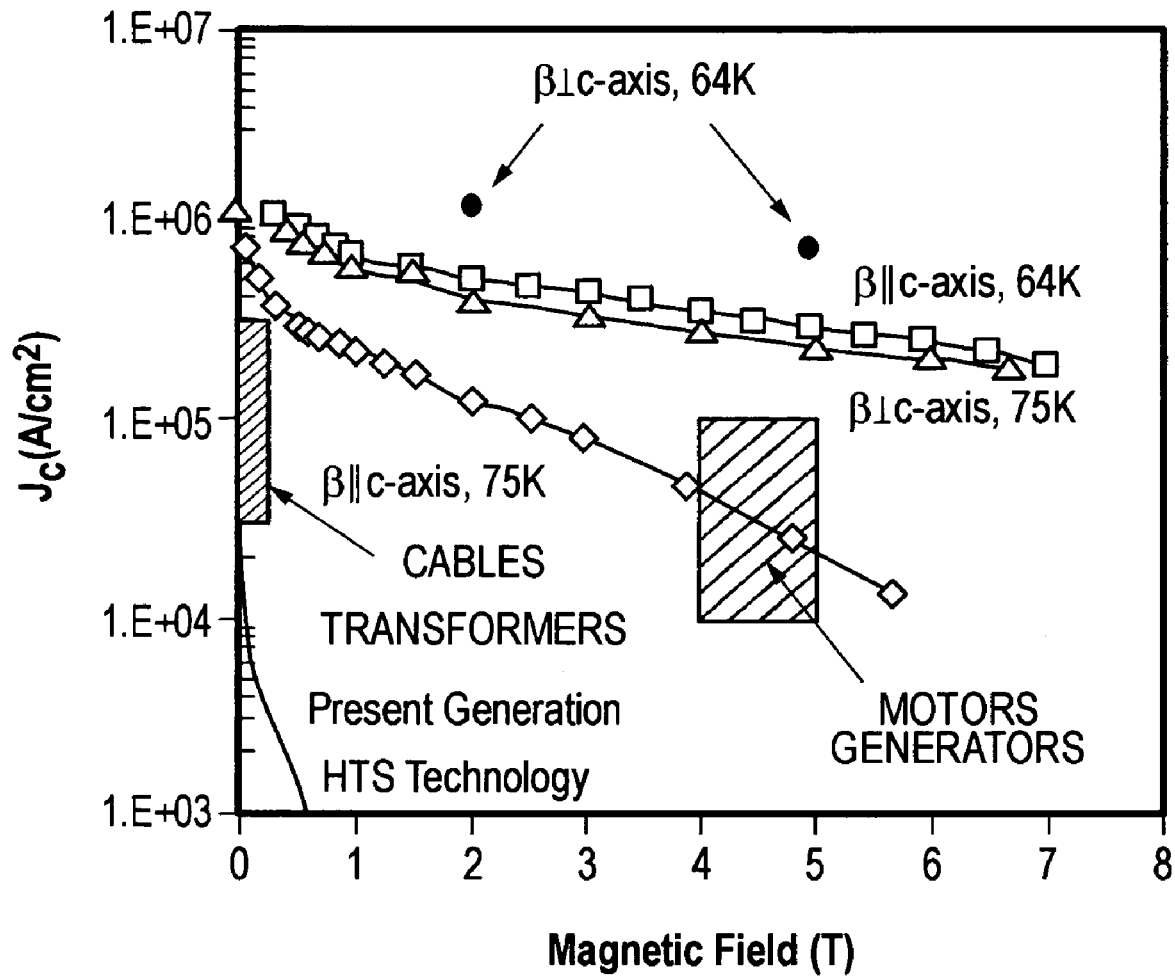
FIG. 4 is a chart showing the performance of present generation HTS materials and of YBCO and of on a substrate prepared according to embodiments of the present invention, in magnetic fields of interest for electric-power applications.

FIG. 4 demonstrates that high performance can be achieved in HTS YBCO coated conductor fabricated utilizing the processes described herein, in high magnetic fields at 75K and 64K. The performance of the coated conductor far exceeds that of present generation BSCCO-based HTS tape technology and meets the requirements of various electric power devices, in which the HTS conductor may be utilized.

Figure 5:
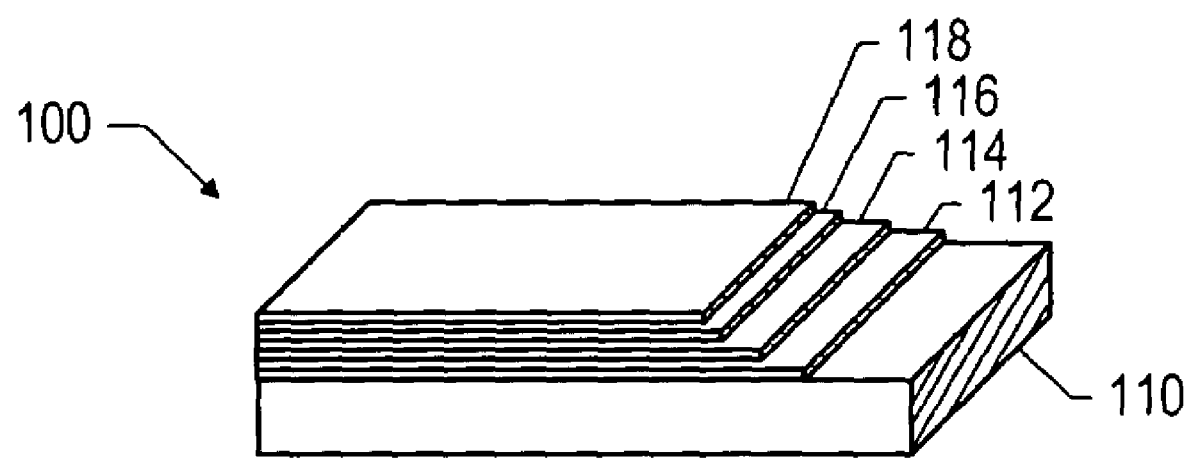
FIG. 5 illustrates the structure of an HTS coated conductor (tape) according to an embodiment of the present invention.

FIG. 5 illustrates the general structure of an embodiment of the present invention. FIG. 5 shows a section of an HTS tape (HTS coated conductor) 100, having buffer layer 112, The HTS conductor includes a substrate 110, a buffer layer 112 overlying the substrate 110, an HTS layer 114, followed by a capping layer 116, typically a noble metal layer, and a stabilizer layer 118, typically a non-noble metal.

The substrate 110 is generally metal-based, and typically, an alloy of at least two metallic elements. Particularly suitable substrate materials include nickel-based metal alloys such as the known Inconel® group of alloys. The Inconel® alloys tend to have desirable thermal, chemical and mechanical properties, including coefficient of expansion, thermal and electrical conductivities, Curie temperature, tensile strength, yield strength, and elongation. These metals are generally commercially available in the form of spooled tapes, particularly suitable for HTS tape fabrication, which typically will utilize reel-to-reel tape handling.

In one embodiment, the substrate is treated so as to have desirable surface properties for subsequent deposition of the constituent layers of the HTS tape. For example, the surface may be lightly polished to a desired flatness and surface roughness. Additionally, the substrate may be treated to be biaxially textured as is understood in the art, such as by the known RABiTS (roll assisted biaxially textured substrate) technique.

Turning to the buffer layer 112, the buffer layer may be a single layer, or more commonly, be made up of several films. Most typically, the buffer layer includes a biaxially textured film, having a crystalline texture that is generally aligned along crystal axes both in-plane and out-of-plane of the film. In this regard, the biaxial texture may be quantified as having a mosaic spread not greater than about 30 degrees, such as not greater than about 20 degrees, or even not greater than 10 degrees. Such biaxial texturing may be accomplished by IBAD. As is understood in the art, IBAD is acronym that stands for ion beam assisted deposition, a technique that may be advantageously utilized to form a suitably biaxially textured buffer layer for subsequent formation of an HTS layer having desirable biaxial crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride and silicon carbide. Suitable techniques for deposition of a barrier film include chemical vapor deposition and physical vapor deposition including sputtering. Typical thicknesses of the barrier film may be within a range of about 100-200 angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconductor layer exists. Accordingly, the buffer layer may further include another buffer film, this one in particular implemented to reduce a mismatch in lattice constants between the HTS layer and the underlying IBAD film and/or epitaxial film. This buffer film may be formed of materials such as YSZ (yttria-stabilized zirconia) strontium ruthenate, lanthanum manganite, and generally, perovskite-structured ceramic materials. The buffer film may be deposited by various physical vapor deposition techniques as well as chemical vapor deposition techniques.

While the foregoing mentions implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

The high-temperature superconductor (HTS) layer 114 is formed according to teachings herein, and typically chosen from high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Ti_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. Typically, the HTS layer has a thickness on the order of about 1 to about 30 microns, most typically about 5 to about 20 microns in order to get desirable amperage ratings associated with the HTS layer 14a.

The capping layer 116 and the stabilizer layer 118 are generally implemented for electrical stabilization, to aid in prevention of HTS burnout in practical use. More particularly, layers 116a and 118 aid in continued flow of electrical charges along the HTS conductor in cases where cooling fails or the critical current density is exceeded, and the HTS layer moves from the superconducting state and becomes insulating or semi-conductive. Typically, a noble metal is utilized for capping layer 116 to prevent unwanted interaction between the stabilizer layer(s) and the HTS layer 114. Typical noble metals include gold, silver, platinum, and palladium. Silver is typically used due to its cost and general accessibility. The capping layer 116 is typically made to be thick enough to prevent unwanted diffusion of the components from the stabilizer layer 118 into the HTS layer 114, but is made to be generally thin for cost reasons (raw material and processing costs). Typical thicknesses of the capping layer 116 range within about 0.1 to about 10.0 microns, such as 0.5 to about 5.0 microns. Various techniques may be used for deposition of the capping layer 16a, including physical vapor deposition, such as DC magnetron sputtering.

A stabilizer layer 118 is incorporated, to overlie the superconductor layer 14a, and in particular, overlie and directly contact the capping layer 116 in the particular embodiment shown in FIG. 5. The stabilizer layer 16a functions as a protection/shunt layer to enhance stability against harsh environmental conditions and superconductivity quench. The layer is generally dense and thermally and electrically conductive, and functions to bypass electrical current in case of failure in the superconducting layer.

Figure 6:
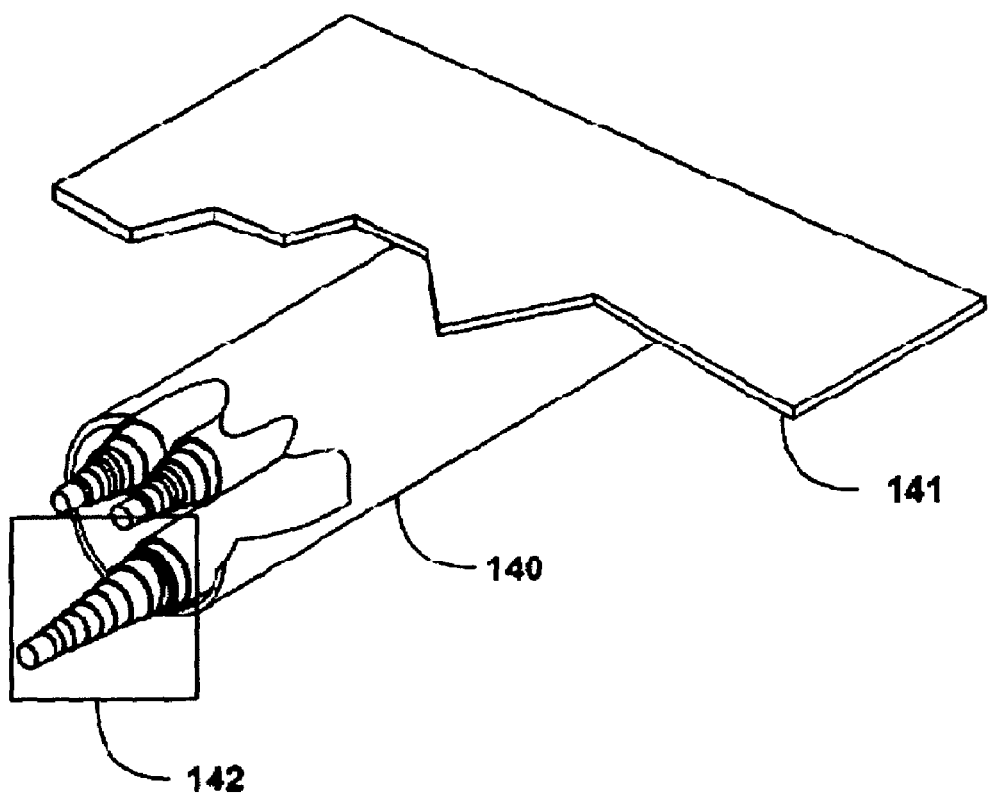
FIGS. 6 and 7 illustrate a power cable in accordance with an embodiment of the present invention.
Figure 7:
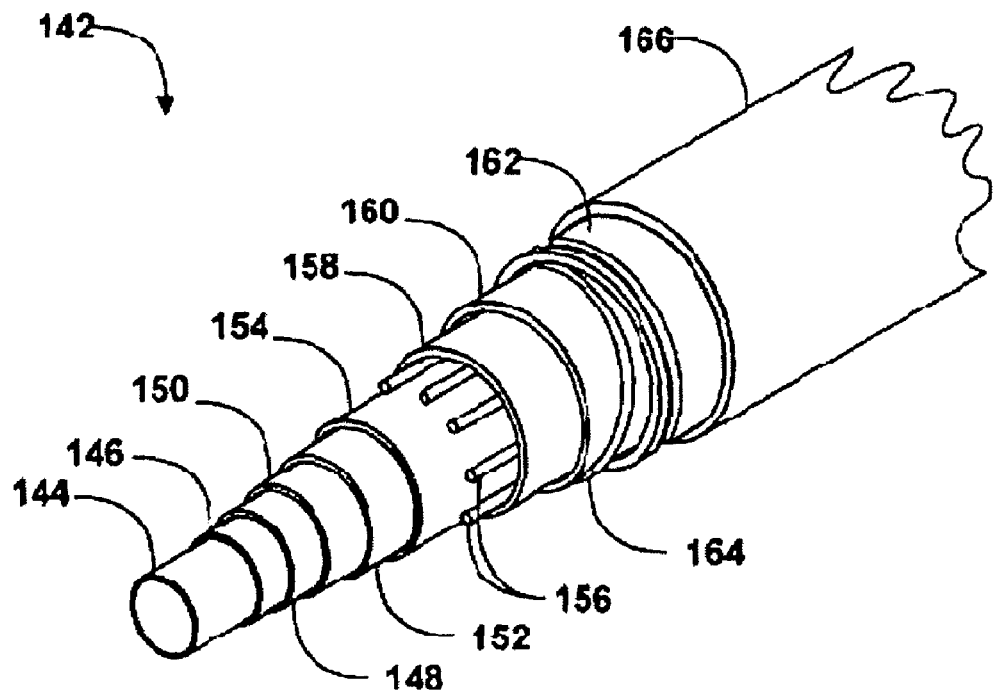

Moving away from the particular structure of the superconducting tape, FIGS. 6 and 7 illustrate implementation of a superconducting tape in a commercial power component, namely a power cable. FIG. 6 illustrates several power cables 142 extending through an underground conduit 140, which may be a plastic or steel conduit. FIG. 6 also illustrates the ground 141 for clarity. As is shown, several power cables may be run through the conduit 140.

Turning to FIG. 7, a particular structure of a power cable is illustrated. In order to provide cooling to maintain the superconductive power cable in a superconducting state, liquid nitrogen is fed through the power cable through LN2 duct 144. One or a plurality of HTS tapes 146 is/are provided so as to cover the duct 144. The tapes may be placed onto the duct 144 in a helical manner, spiraling the tape about the duct 144. Further components include a copper shield 148, a dielectric tape 150 for dielectric separation of the components, a second HTS tape 152, a copper shield 154 having a plurality of centering wires 156, a second, larger LN2 duct 158, thermal insulation 160, provided to aid in maintaining a cryogenic state, a corrugated steel pipe 162 for structural support, including skid wires 164, and an outer enclosure 66.

Figure 8:
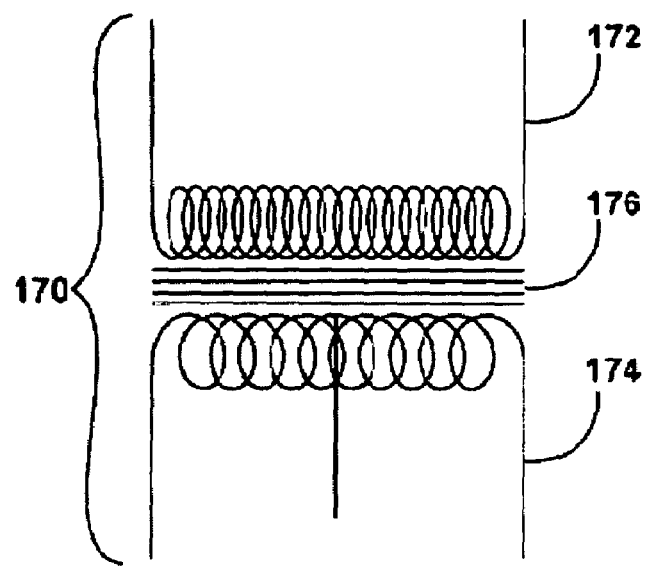
FIG. 8 is a schematic of a transformer according to an embodiment of the present invention.
Figure 9:
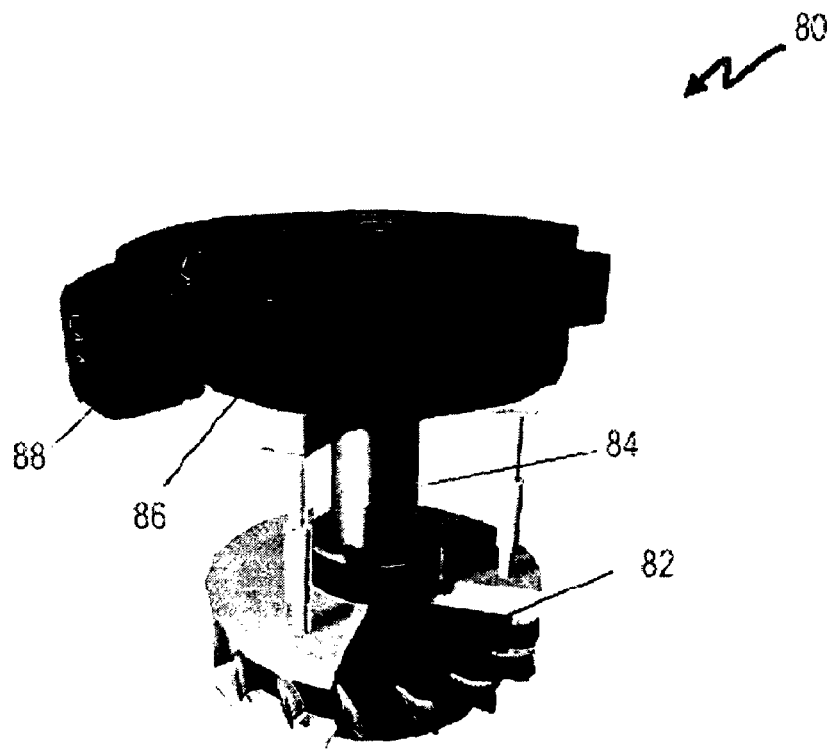
FIG. 9 is a power generator according to an embodiment of the present invention.

FIG. 8 illustrates schematically a power transformer having a central core 176 around which a primary winding 172 and a secondary winding 174 are provided. It is noted that FIG. 8 is schematic in nature, and the actual geometric configuration of the transformer may vary as is well understood in the art. However, the transformer includes the basic primary and secondary windings. In this regard, in the embodiment shown in FIG. 8, the primary winding has a higher number of coils than the secondary winding 174, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive tapes in accordance with the foregoing description Turning to FIG. 9, the basic structure of a generator is provided. The generator includes a turbine 182 connected to a shaft 184 for rotatably driving a rotor 186. Rotor 186 includes high-intensity electromagnets, which are formed of rotor coils that form the desired electromagnetic field for power generation. The turbine 182, and hence the shaft 184 and the rotor 186 are rotated by action of a flowing fluid such as water in the case of a hydroelectric power generator, or steam in the case of nuclear, diesel, or coal-burning power generators. The generation of the electromagnetic field generates power in the stator 188, which comprises at least one conductive winding. According to a particular feature of the embodiment, at least one of the rotor coils and the stator winding comprises a superconductive tape in accordance with embodiments described above. Typically, at least the rotor coils include a superconductive tape, which is effective to reduce hysteresis losses.

Figure 10:
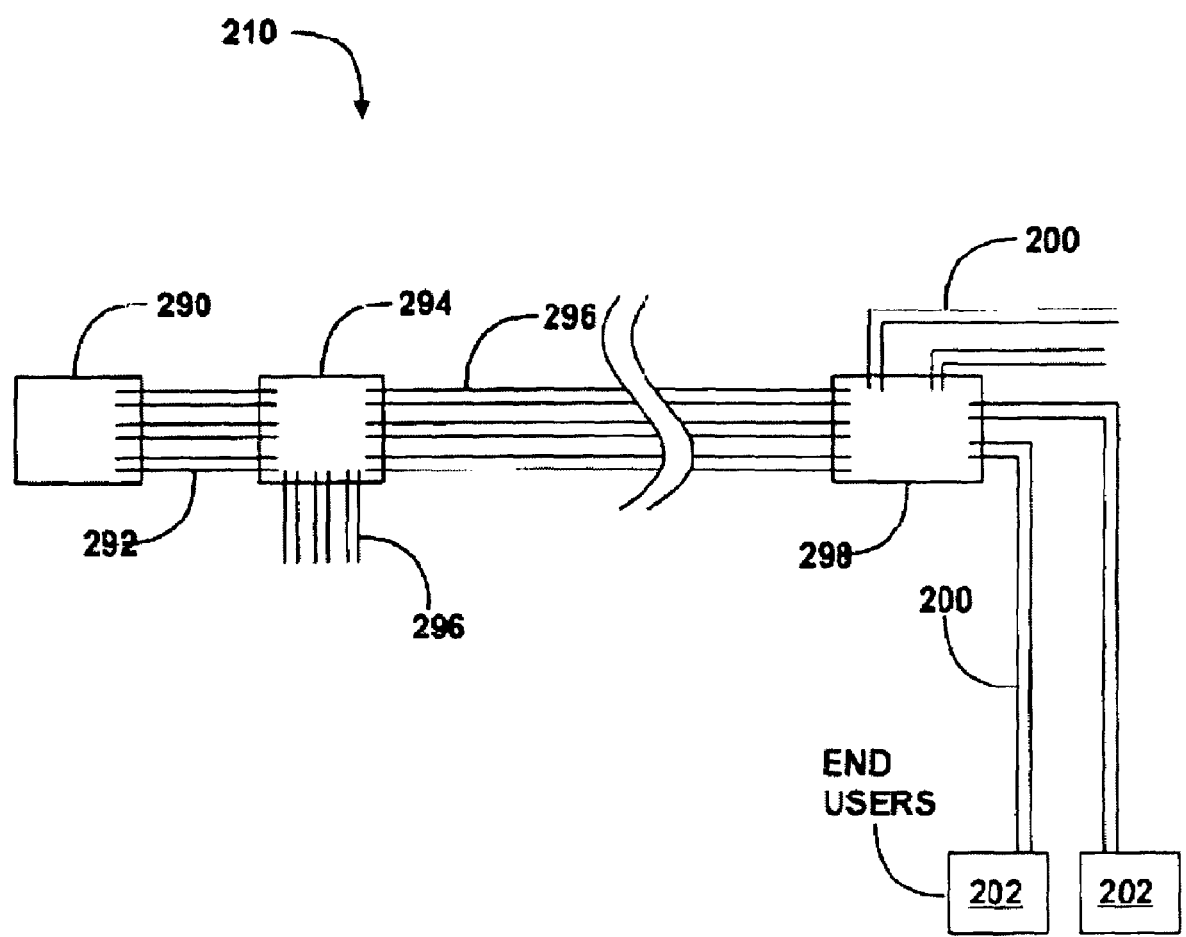
FIG. 10 is a power grid according to an embodiment of the present invention.

Turning to FIG. 10, a basic schematic of a power grid is provided. Fundamentally, the power grid 210 includes a power plant 290 typically housing a plurality of power generators. The power plant 290 is electrically connected and typically co-located with a transmission substation 294. The transmission substation contains generally a bank of step-up power transformers, which are utilized to step-up voltage of the generated power. Typically, power is generated at a voltage level on the order of thousands of volts, and the transmission substation functions to step-up voltages are on the order of 100,000 to 1,000,000 volts in order to reduce line losses. Typical transmission distances are on the order of 50 to 1,000 miles, and power is carried along those distances by power transmission cables 296. The power transmission cables 96 are routed to a plurality of power substations 298 (only one shown in FIG. 10). The power substations contain generally a bank of step-down power transformers, to reduce the transmission level voltage from the relatively high values to distribution voltages, typically less than about 10,000 volts. A plurality of further power substations may also be located in a grid-like fashion, provided in localized areas for localized power distribution to end users. However, for simplicity, only a single power substation is shown, noting that downstream power substations may be provided in series. The distribution level power is then transmitted along power distribution cables 200 to end users 202, which include commercial end users as well as residential end users. It is also noted that individual transformers may be locally provided for individual or groups of end users. According to a particular feature, at least one of the generators provided in the power plant 290, the transformers and the transmission substation, the power transmission cable, the transformers provided in the power substation, and the power distribution cables contain superconductive tapes in accordance with the present description.

Having described embodiments of the present invention, the following example is provided to illustrate a specific working example.

EXAMPLE

Tetramethyl heptanedionates of yttrium, barium [adducted with phenanthroline] and copper are obtained from Inorgatech, Mildenhall, Suffolk, U.K. The Y compound is dissolved in solvent containing 2 parts of THF and 1 part isopropanol. The Ba compound is dissolved is a solvent containing 3.5 parts THF and 1 part isopropanol. The Cu compound is dissolved only in THF. The molarity of overall solution is 0.03 M/l.

The liquid components are combined at room temperature in an ultrasound mixer in the ratio of 1 part Y composition, 2.15 parts Ba composition and 3 parts Cu composition. The mixed liquid precursor is pumped at a rate of 0.25 ml/min through a HPLC pump. From the pump, the precursor is pumped through 0.0625" OD, 0.010" ID stainless steel tubing at a pressure of 5 psi to the vaporizer.

The mixed component precursor enters the vaporizer through the nozzle that is made from a 0.0625" OD, 0.01" ID tubing swaged to an ID of 0.004" at tip. The tip is placed in a vaporizer that is maintained at 240° C. using a band heater and heating jackets. The orifice is surrounded by an annular argon gas injector. The argon is supplied to the vaporizer at the rate of 1000 ml/min.

The vaporized precursors ate transferred to the reactor through 1.5"-diameter stainless steel tubing. The composition is maintained at a temperature of 240° C. while in the delivery tubing.

The reactor, a cold wall type, is maintained at a pressure of 1.6 Torr. The composition is introduced into the reactor through a showerhead. Heating and cooling coils to maintain the temperature in the range of about 235° C. surround the showerhead. In this example the showerhead is comprised of two 2.75" con-flat flanges bolted together. The top flange is connected to the tubing from the vaporizer. The bottom flange has perforations disposed uniformly on the surface. The plate has a thickness of about 6 mm, and the perforations are about 0.02 to 0.03" in diameter. The length of the perforation is about 6 mm, sufficient to direct the flow downward. The showerhead can deliver precursors over a diameter of 2.5 cm over the substrate.

Oxygen is introduced into the showerhead at a flow rate of 500 ccm.

The substrate, comprising of an Inconel 625 metal tape, is introduced into the reactor and heated, utilizing a substrate heater, to a temperature of 775° C. The substrate has a biaxially-textured layer of YSZ produced by IBAD and a layer of ceria on top of the YSZ. The YSZ layer is about 1.5 microns thick and the ceria is about 20 nm thick.

The vaporized precursor entering the reactor through the showerhead contacts the substrate and is deposited as a thin film.

The resulting coated substrate is cooled to ambient temperature in an oxygen rich atmosphere over a period of 1 hour.

Modifications and variations of the of the teachings here are within the scope of those of skill in the art, and still fall within the scope of the present claims.

What is claimed is:

1. A method of forming an HTS conductor by chemical vapor deposition, comprising:
    providing chemical vapor phase reactants in a deposition chamber; and
    reacting the vapor phase reactants with each other to form a reaction product that deposits onto a metallic substrate in a deposition chamber to form a high temperature superconducting thin film, the thin film having a critical current not less than about 100 A/cm width at 77K and self field and a current density not less than about 1 MA/cm$^2$ at 77K and self field.

2. The method of claim 1, wherein further comprising providing precursors in a liquid solution, and vaporizing the liquid solution to form the vapor phase reactants.

3. The method of claim 2, wherein the liquid solution has a molarity within a range of about 0.003 M/L to about 0.03 M/L.

4. The method of claim 2, wherein vaporization is carried out in a vaporizer, the vaporizer being in fluid communication with the deposition chamber.

5. The method of claim 4, wherein the vapor phase reactants are introduced into the deposition chamber through a showerhead.

6. The method of claim 5, wherein the showerhead is maintained at a temperature within a range of about 210° C. to about 270° C.

7. The method of claim 2, wherein vaporization is carried out by flash vaporization.

8. The method of claim 1, wherein a pressure in the deposition chamber is sub-atmospheric.

9. The method of claim 8, wherein the pressure within a range of about 1 to about 500 Torr.

10. The method of claim 2, wherein said precursors comprise tetramethyl heptanedionates precursors.

11. The method of claim 10, wherein said precursors comprise Ba, Cu, and rare earth tetramethyl heptanedionates precursors.

12. The method of claim 1, wherein the substrate is heated to a temperature of about 700° C. to about 850° C.

13. The method of claim 1, further comprising introducing oxygen into the deposition chamber during deposition of the reaction product.

14. The method of claim 13, wherein an oxygen partial pressure in the deposition chamber is within a range of about 0.3 to about 100 Torr.

15. The method of claim 1, wherein the superconducting thin film comprises $REBa_2Cu_3O_{7-x}$, wherein RE is a rare earth element.

16. The method of claim 15, wherein RE comprises Y.

17. The method of claim 1, wherein the metallic substrate comprises an alloy.

18. The method of claim 17, wherein the metallic substrate comprises nickel.

19. The method of claim 1, wherein the metallic substrate is biaxially textured.

20. A method of forming an HTS conductor by chemical vapor deposition, comprising:
   providing chemical vapor phase reactants in a deposition chamber; and
   reacting the vapor phase reactants with each other to form a reaction product that deposits onto a metallic substrate in a deposition chamber to form a high temperature superconducting thin film, the thin film having a critical current not less than about 100 A/cm width at 77K and self field and a current density not less than about 1 $MA/cm^2$ at 77K and self field, wherein the substrate is in the form of a tape, the substrate being passed through the deposition chamber by a reel-to-reel process.

* * * * *

UNITED STATES PATENT AND TRADEMARK OFFICE
CERTIFICATE OF CORRECTION

| | |
|---|---|
| PATENT NO. | : 7,521,082 B2 |
| APPLICATION NO. | : 10/610072 |
| DATED | : April 21, 2009 |
| INVENTOR(S) | : Venkat Selvamanickam |

It is certified that error appears in the above-identified patent and that said Letters Patent is hereby corrected as shown below:

Title page, item (60) delete the priority application number "60/233,175" and insert therefor

--60/223,175--.

Signed and Sealed this
Twenty-eighth Day of June, 2011

David J. Kappos
*Director of the United States Patent and Trademark Office*